United States Patent
Lee et al.

(10) Patent No.: US 10,124,438 B2
(45) Date of Patent: Nov. 13, 2018

(54) METHOD OF PATTERNING GRAPHENE HOLES AND METHOD OF FABRICATING GRAPHENE TRANSPARENT ELECTRODE BY USING PULSE LASER

(71) Applicant: Samsung Electronics Co., Ltd., Suwon-si, Gyeonggi-do (KR)

(72) Inventors: Jeongyub Lee, Yongin-si (KR); Yunsung Woo, Yongin-si (KR); Changseung Lee, Yongin-si (KR); Eunhyoung Cho, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 423 days.

(21) Appl. No.: 15/065,488

(22) Filed: Mar. 9, 2016

(65) Prior Publication Data

US 2017/0064839 A1    Mar. 2, 2017

(30) Foreign Application Priority Data

Aug. 27, 2015   (KR) .................. 10-2015-0121033

(51) Int. Cl.
*H05K 3/02*      (2006.01)
*B23K 26/0622*   (2014.01)
(Continued)

(52) U.S. Cl.
CPC ...... *B23K 26/0622* (2015.10); *B23K 26/0624* (2015.10); *B23K 26/082* (2015.10);
(Continued)

(58) Field of Classification Search
CPC ......... B82Y 20/00; B82Y 30/00; B82Y 40/00; B82Y 99/00; B23K 26/006; B23K 26/0066; B23K 26/0084; B23K 26/0622; B23K 26/0624; B23K 26/0626; B23K 26/08; B23K 26/082; B23K 26/083; B23K 26/0838; B23K 26/0853; B23K 26/0869; B23K 26/0876; B23K 26/352; B23K 26/382; B23K 26/384; B23K 26/386; B23K 26/388; B23K 26/40; H05K 2201/0108; H05K 2201/0116; H05K 2201/0257;
(Continued)

(56) References Cited

U.S. PATENT DOCUMENTS 8,178,028 B2 * 5/2012 Gandhi .............. B23K 26/0624
                                                      219/121.69
2013/0183625 A1   7/2013 Sung et al.
(Continued)

FOREIGN PATENT DOCUMENTS

JP   2005066687 A   3/2005
KR   20120086050 A  8/2012
(Continued)

*Primary Examiner* — A. Dexter Tugbang
*Assistant Examiner* — Joshua D Anderson
(74) *Attorney, Agent, or Firm* — Harness, Dickey & Pierce, P.L.C.

(57) ABSTRACT

A method of patterning holes includes placing a substrate on a stage of a laser system, the substrate having a graphene layer on a surface thereof, generating a pulse laser from the laser system, and forming a plurality of hole patterns spaced apart from each other on the graphene layer by irradiating the pulse laser while the graphene layer is in motion.

15 Claims, 5 Drawing Sheets

(51) Int. Cl.
*B23K 26/384* (2014.01)
*H05K 3/18* (2006.01)
*B23K 26/08* (2014.01)
*H01L 31/18* (2006.01)
*H05K 3/00* (2006.01)
*B23K 26/386* (2014.01)
*B23K 26/082* (2014.01)
*H05K 3/14* (2006.01)

(52) U.S. Cl.
CPC ........ *B23K 26/083* (2013.01); *B23K 26/0853* (2013.01); *B23K 26/0869* (2013.01); *B23K 26/384* (2015.10); *B23K 26/386* (2013.01); *H01L 31/1884* (2013.01); *H05K 3/0047* (2013.01); *H05K 3/146* (2013.01); *H05K 2201/0108* (2013.01); *H05K 2201/0145* (2013.01); *H05K 2201/0154* (2013.01); *H05K 2201/0323* (2013.01); *H05K 2201/10128* (2013.01); *H05K 2203/107* (2013.01)

(58) Field of Classification Search
CPC ......... H05K 2201/026; H05K 2201/03; H05K 2201/0323; H05K 2201/10128; H05K 2201/09736; H05K 2203/107; H01L 31/1884

See application file for complete search history.

(56) References Cited

U.S. PATENT DOCUMENTS

| | | | |
|---|---|---|---|
| 2013/0285092 A1* | 10/2013 | Wei | H01L 33/46 257/98 |
| 2014/0017444 A1* | 1/2014 | Shimizu | G02F 1/13439 428/131 |
| 2014/0065359 A1* | 3/2014 | Udapi Roa Kulkarni | B23K 26/0661 428/141 |
| 2014/0212818 A1 | 7/2014 | Kang et al. | |
| 2015/0125990 A1 | 5/2015 | Moslehi et al. | |

FOREIGN PATENT DOCUMENTS

| | | |
|---|---|---|
| KR | 2013 0027535 A | 3/2013 |
| KR | 101262173 B1 | 5/2013 |

* cited by examiner

# METHOD OF PATTERNING GRAPHENE HOLES AND METHOD OF FABRICATING GRAPHENE TRANSPARENT ELECTRODE BY USING PULSE LASER

CROSS-REFERENCE TO RELATED APPLICATION

This application claims the benefit of Korean Patent Application No. 10-2015-0121033, filed on Aug. 27, 2015, in the Korean Intellectual Property Office (KIPO), the disclosure of which is incorporated herein in its entirety by reference.

BACKGROUND

1. Field

Example embodiments relate to methods of patterning holes spaced apart from each other in a graphene layer and/or methods of fabricating a transparent electrode by using the patterned graphene layer and adjusting a scanning speed and a repetition rate of a pulse laser.

2. Description of the Related Art

Display devices and other various devices (e.g., solar cells) need a transparent electrode, which is generally made of indium tin oxide (ITO). However, as use of indium increases, the price thereof rises as resources are depleted. Also, an ITO electrode has insufficient ductility, and thus, cracks are generated when the ITO electrode is bent. Accordingly, the resistance of the ITO electrode should be increased. Therefore, there is a need for an electrode material that may substitute ITO and studies on graphene as an alternative material have been performed.

The transmittance of graphene in a visible region is important in order to use graphene to manufacture a transparent electrode of various display devices. Because graphene is a material that reduces the transmittance of a transparent electrode by about 2.3% per mono-layer, a method of forming hole patterns by making many holes in a line in the graphene has been used to increase the light transmittance of graphene and obtain an effective transmittance suitable for a transparent electrode of a display device. A photo process using a photosensitive photoresist, which is a semiconductor process, and a reactive ion etching (RIE) method of applying an oxygen plasma have been used for patterning graphene holes.

However, with regard to the photo process using the photosensitive photoresist, the graphene transferred onto a transparent polymer substrate may be torn due to weak adhesiveness between the transparent polymer substrate and a graphene material during a photoresist removing process. Additionally, a contact resistance of the graphene may increase, and thus, perfectly removing the photoresist from graphene may be difficult. Furthermore, when the RIE method is used and oxygen plasma is applied for etching, the transparent polymer substrate may be damaged as not only graphene but also the transparent polymer substrate is etched.

SUMMARY

Example embodiments provide methods of patterning holes spaced apart from each other in a graphene layer and/or methods of fabricating a transparent electrode by using the patterned graphene layer and adjusting a scanning speed and a repetition rate of a pulse laser.

Additional aspects will be set forth in part in the description which follows and, in part, will be apparent from the description, or may be learned by practice of the presented example embodiments.

According to example embodiments, a method of patterning graphene holes includes placing a substrate on a stage of a laser system, the substrate having a graphene layer on a surface thereof, generating a pulse laser from the laser system, and forming a plurality of hole patterns spaced apart from each other on the graphene layer by irradiating the pulse laser while the graphene layer is in motion.

The substrate may be a flexible transparent substrate.

The pulse laser may have a wavelength of about 400 nm to about 1200 nm.

The method of patterning the graphene holes may further include reducing a surface resistance of the graphene layer by performing chemical doping on the graphene layer.

Forming the plurality of hole patterns may include one of moving the stage and scanning the pulse laser.

A pulse width of the pulse laser may be about 1 ns to about 200 ns.

An average output of the pulse laser may be about 20 mW to about 600 mW.

A scanning speed of the pulse laser may be about 200 mm/s to about 1,000 mm/s.

A repetition rate of the pulse laser may be about 3 kHz to about 100 kHz.

According to example embodiments, a method of fabricating a graphene transparent electrode includes providing a flexible transparent substrate, forming a graphene layer on the flexible transparent substrate, placing the flexible transparent substrate on a stage of a laser system, generating a pulse laser from the laser system, and forming a plurality of hole patterns spaced apart from each other on the graphene layer by irradiating the pulse laser while the graphene layer is in motion.

The pulse laser may have a wavelength of about 400 nm to about 1200 nm.

The method of fabricating the graphene transparent electrode may further include reducing a surface resistance of the graphene layer by performing chemical doping on the graphene layer.

Forming the plurality of hole patterns may include one of moving the stage and scanning the pulse laser.

A pulse width of the pulse laser may be about 1 ns to about 200 ns.

An average output of the pulse laser may be about 20 mW to about 600 mW.

A scanning speed of the pulse laser may be about 200 mm/s to about 1,000 mm/s.

A repetition rate of the pulse laser may be about 3 kHz to about 100 kHz.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
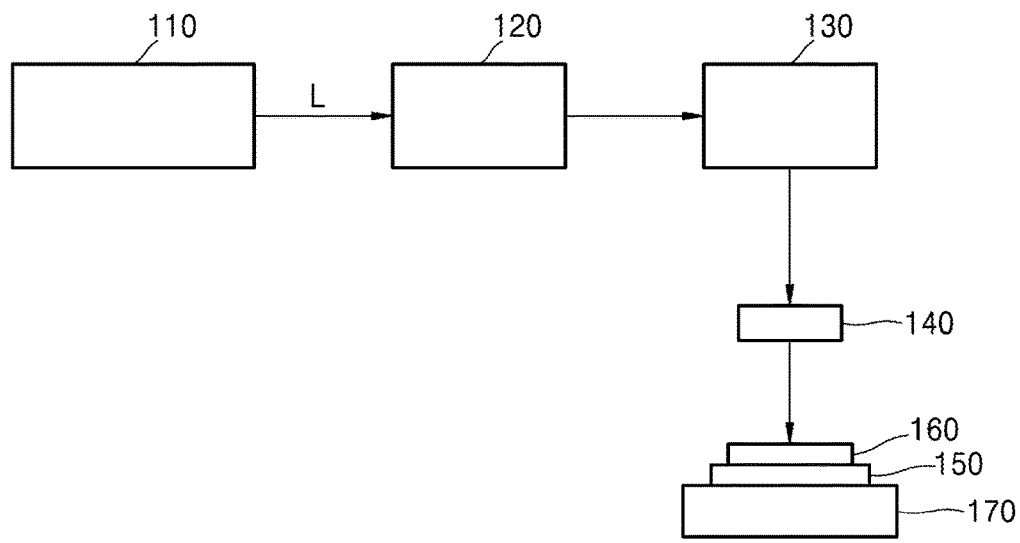
FIG. 1 is a schematic view of a laser system for performing a method of patterning graphene holes and a method of fabricating a graphene transparent electrode, according to example embodiments.

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects. Expressions such as "at least one of" when preceding a list of elements, modify the entire list of elements and do not modify the individual elements of the list.

Throughout the specification, it will be understood that when a unit is referred to as being "connected" to another element, it may be "directly connected" to the other element or "electrically connected" to the other element in a state in which intervening elements are present. In addition, it will be understood that when a unit is referred to as "comprising" another element, it may not exclude the other element but may further include the other element unless specifically oppositely indicates. Expressions such as "at least one of," when preceding a list of elements, modify the entire list of elements and do not modify the individual elements of the list.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

FIG. 1 is a schematic view of a laser system for performing a method of patterning graphene holes and a method of fabricating a graphene transparent electrode, according to example embodiments.

Referring to FIG. 1, a substrate 150 is provided. The substrate 150 may be a flexible transparent substrate and may be formed of a polymer. For example, the substrate 150 may be formed of polyethylenenaphthalate (PEN), polyethyleneterephthalate (PET), polycarbonate, polyvinylalcohol, polyacrylrate, polyimide, polynorbornene, or polyethersulfone (PES), but is not limited thereto.

A graphene layer 160 is formed on the substrate 150. As a forming process of the graphene layer 160, a process (e.g., chemical vapor deposition (CVD), thermal chemical vapor deposition (TCVD), rapid thermal chemical vapor deposition (PTCVD), plasma enhanced chemical vapor deposition (PECVD), inductive coupled plasma chemical vapor deposition (ICP-CVD), and atomic layer deposition (ATLD)) may be used. As a vapor carbon supply source, at least one selected from a group including carbon atoms (e.g., methane ($CH_4$), carbon monoxide (CO), ethane ($C_2H_6$), ethylene ($CH_2$), ethanol ($C_2H_5$), acetylene ($C_2H_2$), propane ($CH_3CH_2CH_3$), propylene ($C_3H_6$), butane ($C_4H_{10}$), pentane ($CH_3(CH_2)_3CH_3$), pentene ($C_5H_{10}$), cyclopentadiene ($C_5H_6$), hexane ($C_6H_{14}$), cyclohexane ($C_6H_{12}$), benzene ($C_6H_6$), and toluene ($C_7H_8$)) may be used.

Furthermore, a doping process may be performed on the graphene layer 160. The doping process may be dry or wet-doping. It is possible to reduce a surface resistance of the graphene layer 160 without reducing a transmittance of the graphene layer 160 by using a dopant not absorbing light in a visible light region. Therefore, it is possible to improve electrical properties (surface resistance) while ensuring optical characteristics (transmittance) of the graphene layer 160.

The substrate 150 having the graphene layer 160 on a surface is placed onto a stage 170. The laser system processes a processing object mounted on the stage 170 with a laser. The laser system may include a laser light source 110, a beam transmission system 120, a scanner 130, and a focusing lens 140.

The laser light source 110 is a source that emits a laser and may be a gas laser light source, a liquid laser light source, and a solid laser light source according to a type of a material generating a laser. The laser light source 110 emits a pulse laser L.

The pulse laser L emitted from the laser light source 110 enters the beam transmission system 120. The beam transmission system 120 transmits the pulse laser L emitted from the laser light source 110 along a prescribed progress path, and may include, for example, a plurality of mirrors or an optical cable.

The pulse laser L that passed through the beam transmission system 120 further enters the scanner 130. The scanner 130 may perform processing on the graphene layer 160 by scanning the pulse laser L on the graphene layer 160. The scanner 130 may be located in a region in which the graphene layer 160 is to be processed, and may control a linear movement of the pulse laser L.

The focusing lens 140 adjusts the focus of the pulse laser L so that the pulse laser L which passed through the scanner 130 may be focused at a desired position of the graphene layer 160. When the pulse laser L which passed through the focusing lens 140 is irradiated on the graphene layer 160, hole patterns are formed on the graphene layer 160 due to moving of the stage 170 onto which the substrate 150 having the graphene layer 160 is placed. Therefore, if the stage 170 is moved in a desired manner while continuously irradiating the pulse laser L on the graphene layer 160, patterns having a desired manner may be formed on the graphene layer 160 which is an object to be processed.

Furthermore, it may be possible to form hole patterns in a desired manner on the graphene layer 160 even by scanning the pulse laser L in a desired manner via the scanner 130 while keeping the stage 170 fixed. In other words, a path of the pulse laser L is changed by the movement of a mirror included in the scanner 130, and thus, it is possible to form hole patterns according to a relatively high speed movement of the graphene layer 160 on the stage 170.

Furthermore, the linear movement of the pulse laser L via the stage 170 and the scanner 130 may be controlled for scanning at high-speed.

Figure 2:
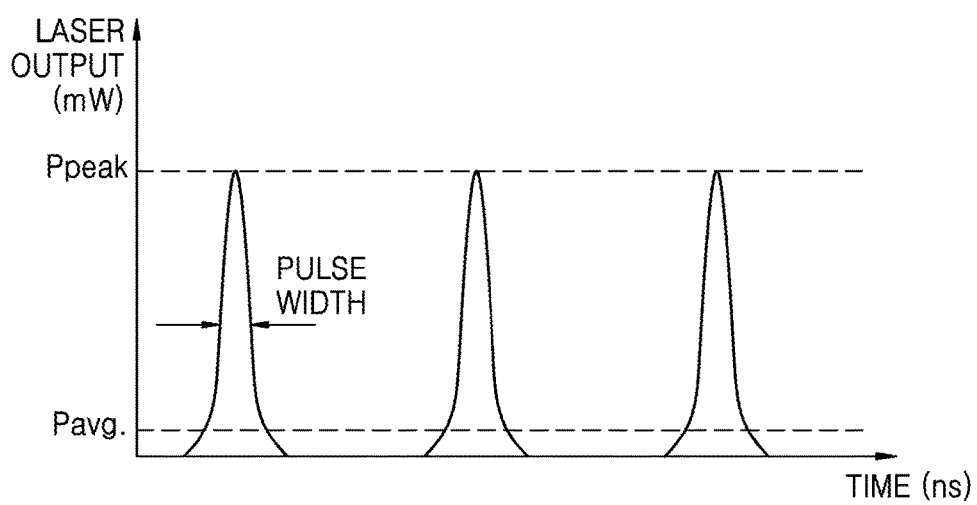
FIG. 2 is a graph illustrating a pulse waveform of a laser beam emitted from a laser system.

FIG. 2 is a graph illustrating a pulse waveform of a laser beam emitted from a laser system.

Referring to FIG. 2, the laser light source 110 of FIG. 1 emits the pulse laser L. The pulse laser L may have a wavelength of about 400 nm to 1200 nm in order not to damage the flexible transparent substrate 150 (of FIG. 1) having a relatively high rate of absorption with respect to a ultraviolet wavelength region. Furthermore, the pulse laser L may have an infrared wavelength or a green wavelength. The length of the infrared wavelength of the pulse laser L may be 1,064 nm and that of the green wavelength of the pulse laser L may be 532 nm. By using the pulse laser L in a range of the above wavelengths, it is possible to pattern precisely and clearly the graphene layer 160 (of FIG. 10) without damaging the flexible transparent substrate 150 (of FIG. 1).

The pulse laser L is characterized by a starting time and a stopping time. Each pulse of the pulse laser L may be defined as a pulse width and a maximum output Ppeak. The maximum output Ppeak is a maximum laser output of each pulse. The pulse width may be defined as a full width at half maximum (FWHM). In other words, the pulse width means a time difference between points at half the maximum output Ppeak of adjacent pulses. An average output Pavg means an average value of an output represented by using the pulse laser L. The average output Pavg and the pulse width may be adjusted in the laser system, and a value of the maximum output Ppeak is set according to the average output Pavg and the pulse width. The pulse laser L has a pulse shape repeating in an identical form at a prescribed period, and a frequency of the repeating pulse per second is referred to as a repetition rate.

Figure 3:
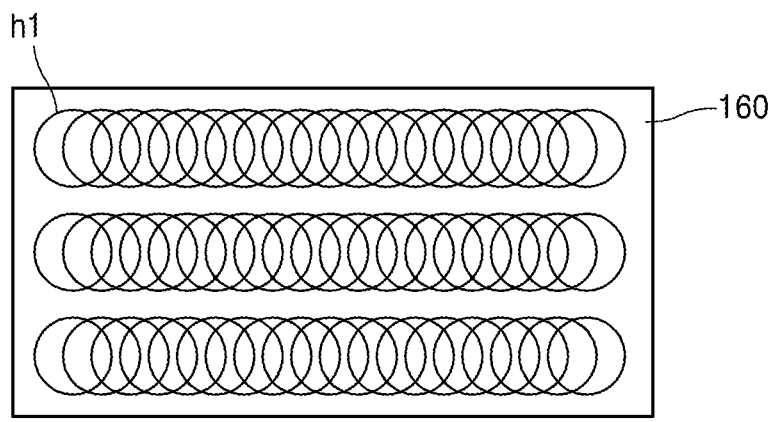
FIG. 3 is a view illustrating hole patterns formed on a graphene layer, according to example embodiments.

FIG. 3 illustrates hole patterns h1 formed on the graphene layer 160, according to example embodiments.

Referring to FIG. 3, the pulse laser L emitted from the laser light source 110 (of FIG. 1) is irradiated on the graphene layer 160. The graphene layer 160 is formed on the substrate 150 (of FIG. 1) and the substrate 150 is placed onto the stage 170 (of FIG. 1). When the pulse laser L is irradiated on the graphene layer 160, it is possible to process the graphene layer 160 by moving the stage 170 or linearly moving the pulse laser L using the scanner 130 (of FIG. 1). FIG. 3 illustrates forms of lines that are processed by overlapping hole patterns h1 by using the pulse laser L. In this case, a transmittance of the graphene layer 160 may be increased compared to that of graphene not having the hole patterns h1. However, a surface resistance of the graphene layer 160 may also increase as an effective cross-section of the graphene decreases.

Figure 4:
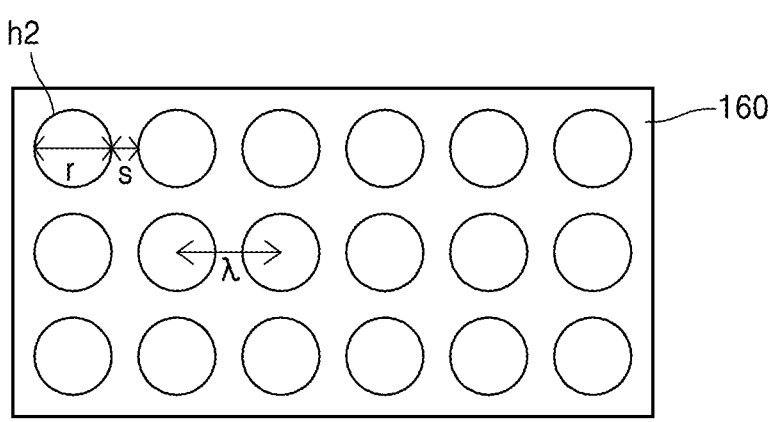
FIG. 4 is a view of hole patterns formed on a graphene layer, according to example embodiments.

FIG. 4 is a view of hole patterns h2 formed on the graphene layer 160, according to example embodiments.

Referring to FIG. 4, the hole patterns h2 formed on the graphene layer 160 are spaced apart from each other. A hole diameter r represents a length of a diameter of one of the hole patterns h2, a spacing s represents a minimum distance between the hole patterns h2, and a hole interval λ represents a distance between the centers of the adjacent hole patterns h2. The hole interval λ may be proportional to a scanning speed and may be inversely proportional to a repetition rate. The scanning speed represents a moving speed of the pulse laser L when the pulse laser L is irradiated on the graphene layer 160, and may be controlled via the scanner 130 (of FIG. 1) or the stage 170 (of FIG. 1). The hole interval λ increases as the scanning speed increases, and the hole interval λ decreases as the repetition rate increases. Therefore, the scanning speed needs to increase and the repetition rate needs to decrease in order to increase the hole interval λ. When the hole interval λ becomes greater than the hole diameter r, that is, a value of the spacing s is greater than 0 by adjusting the scanning speed and the repetition rate, the hole patterns h2 may be spaced apart from each other.

According to example embodiments, as illustrated in FIG. 4, there is provided a method of patterning graphene holes, whereby a light transmittance of the graphene layer 160 may be improved by forming the hole patterns h2 spaced apart from each other and having a surface resistance with a relatively low value.

Hereinafter, FIGS. 5 to 9 illustrate a change in a transmittance and a surface resistance according to a pulse width, a change in a hole diameter r according to an average output Pavg, a change in a hole interval λ according to a scanning speed, a change in a transmittance and a surface resistance according to a spacing s, and a change in a transmittance and a surface resistance according to an average output Pavg. A method of patterning graphene holes and a method of fabricating a graphene transparent electrode, whereby a graphene layer has a transmittance of 98.5% or greater and a surface resistance of 3 kΩ/sq or less, are considered by analyzing changes in a transmittance and a surface resistance according to various factors.

Figure 5:
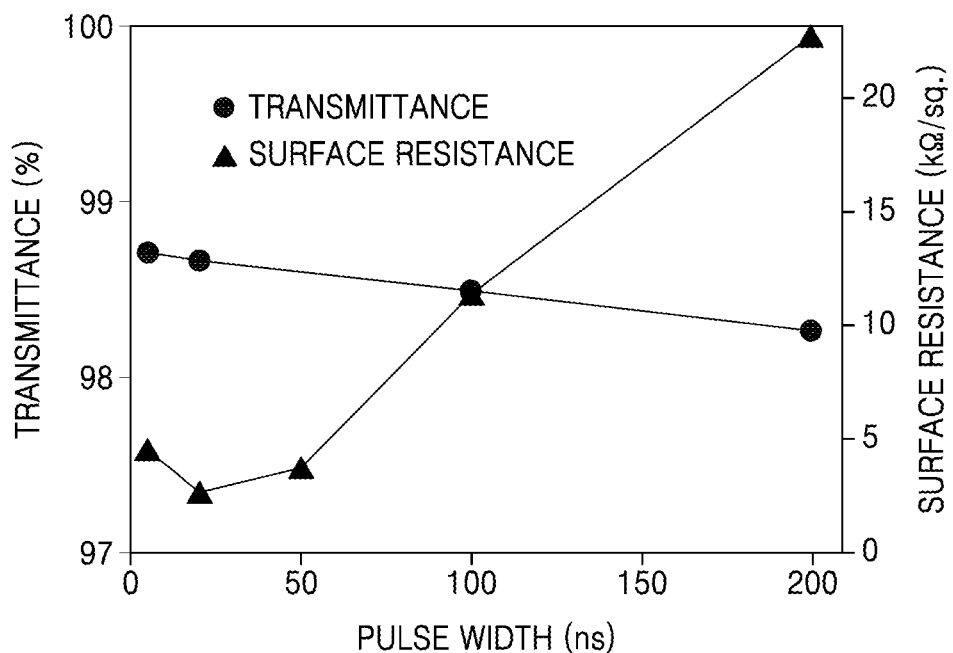
FIG. 5 is a graph illustrating a change in a transmittance and a surface resistance of a graphene layer according to a pulse width of a pulse laser.

FIG. 5 is a graph illustrating a change in a transmittance and a surface resistance of a graphene layer according to a pulse width of a pulse laser.

Referring to FIG. 5, after a scanning speed of the pulse laser is fixed to 380 mm/s and a repetition rate of the pulse laser is fixed to 20 kHz, the transmittance and the surface resistance of the graphene layer are measured after forming hole patterns on the graphene layer while increasing a pulse width of the pulse laser from about 1 ns to about 200 ns.

The transmittance tends to decrease and the surface resistance tends to increase as the pulse width increases. It is possible to pattern graphene holes when the pulse laser L has a pulse width of about 20 ns so that the graphene layer may have a transmittance of 98.5% or greater and a surface resistance of 3 kΩ/sq or less.

Furthermore, a doping process may be performed on the graphene layer 160. The doping process may be dry or wet-doping. Accordingly, it is possible to reduce the surface resistance of the graphene layer without reducing the transmittance of the graphene layer 160 by using a dopant not absorbing light in a visible light region. Therefore, it is possible to improve the electrical properties (surface resistance) while ensuring proper optical characteristics (transmittance) of the graphene layer 160.

Considering a decrease in the surface resistance according to doping, it may be possible to pattern graphene holes so that the graphene layer 160 has a desired transmittance and surface resistance when the pulse width of the pulse laser L is about 1 ns to 50 ns.

Figure 6:
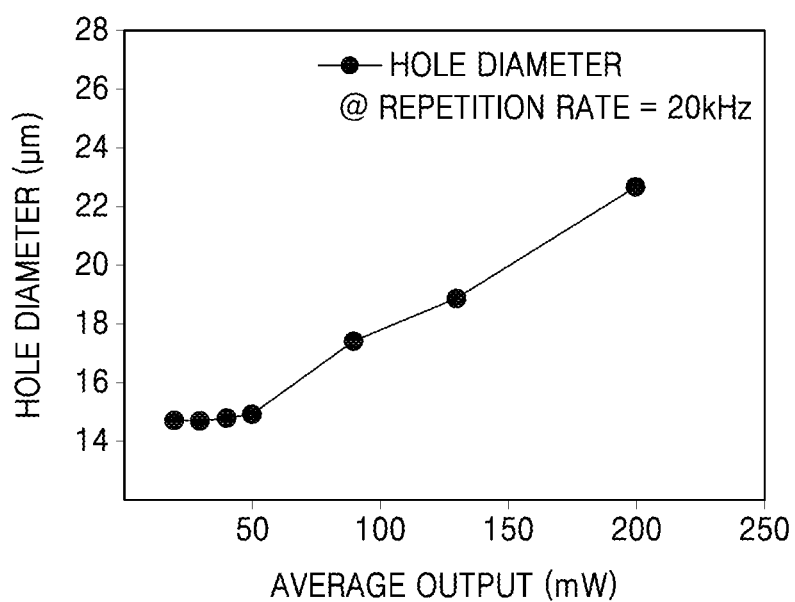
FIG. 6 is a graph illustrating a change in a hole diameter of hole patterns formed on a graphene layer according to an average output of a pulse laser.

FIG. 6 is a graph illustrating a change in a hole diameter r of hole patterns formed on the graphene layer according to the average output Pavg of the pulse laser.

Referring to FIG. 6, after a pulse width of the pulse laser is fixed to 20 ns and a repetition rate as 20 kHz, the hole diameter r of the hole patterns formed on the graphene layer is measured after forming the hole patterns on the graphene layer while increasing the average output Pavg of the pulse laser from 20 mW to 200 mW.

As the average output Pavg increases, the hole diameter r of the hole patterns formed on the graphene layer shows a tendency to increase. As the pulse width of the pulse laser is fixed to 20 ns, the maximum output Ppeak also increases in accordance with an increase in the average output Pavg, and therefore, the hole diameter r of the hole patterns formed on the graphene layer also increases.

Within a range of about 20 mW to about 50 mW of the average output Pavg, the hole diameter r may be about 15 μm.

Figure 7:
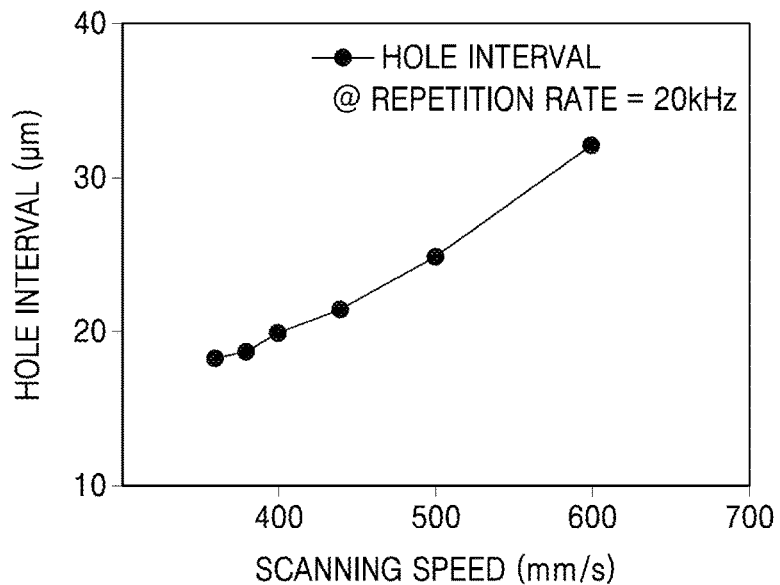
FIG. 7 is a graph illustrating a change of a hole interval of hole patterns formed on a graphene layer according to a scanning speed of a pulse laser.

FIG. 7 is a graph illustrating a change of a hole interval λ of hole patterns formed on a graphene layer according to a scanning speed of a pulse laser.

Referring to FIG. 7, after a pulse width of the pulse laser is fixed to 20 ns and a repetition rate of the pulse laser is fixed to 20 kHz, the hole interval λ of the hole patterns formed on the graphene layer is measured after forming the hole patterns on the graphene layer while increasing the scanning speed of the pulse laser from 200 mm/s to 600 mm/s.

As the average output Pavg increases, the hole interval λ of the hole patterns formed on the graphene layer shows a tendency to increase. As the repetition rate of the pulse laser is fixed to 20 kHz, an interval between pulses irradiated on the graphene layer increases in accordance with an increase in the scanning speed of the pulse laser, therefore, the hole interval λ also increases.

Within a range of about 200 mm/s to 400 mm/s of the scanning speed of the pulse laser, the hole interval λ may be about 20 μm.

Figure 8:
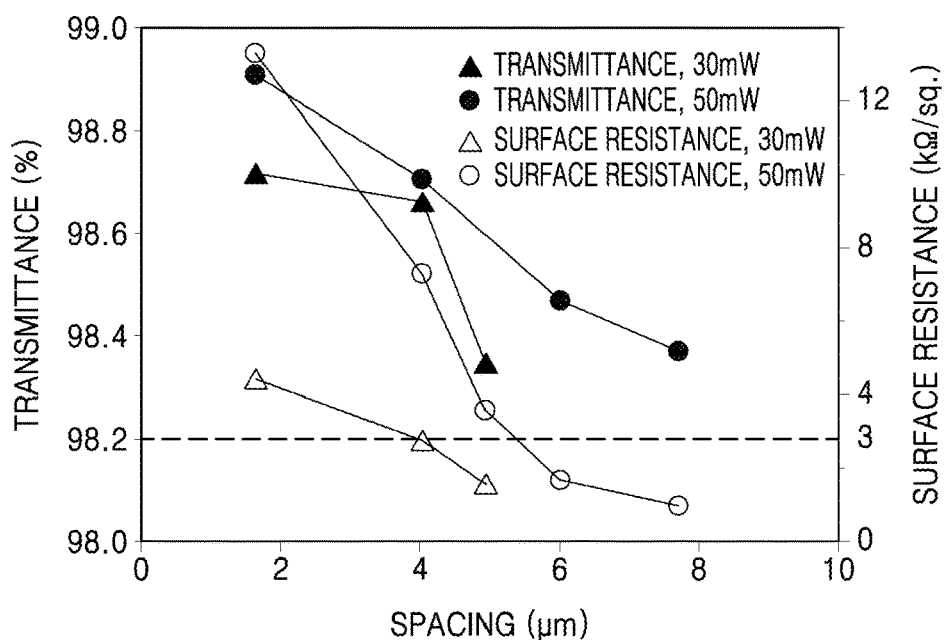
FIG. 8 is a graph illustrating a change of a transmittance and a surface resistance according to a spacing of holes of hole patterns formed on a graphene layer.

FIG. 8 is a graph illustrating a change of a transmittance and a surface resistance according to a spacing s of hole patterns formed on a graphene layer.

Referring to FIG. 8, after a pulse width of the pulse laser is fixed to 20 ns and a repetition rate as 20 kHz, the transmittance and the surface resistance according to the spacing s is measured when average outputs Pavg are 30 mW and 50 mW.

Both the transmittance and the surface resistance tend to decrease when the average outputs Pavg are 30 mW and 50 mW as the spacing s increases. Referring to FIG. 4, when the spacing s increases, a density of the hole patterns h2 formed in the same area decreases. Therefore, the transmittance and the surface resistance also decrease.

When the average output Pavg is about 30 mW and the spacing s is about 4 μm, it is possible to pattern graphene holes so as to have a transmittance of 98.5% or greater and a surface resistance of 3 kΩ/sq or less.

Referring again to FIG. 6, when the average output is about 30 mW, the hole diameter r may be about 15 μm. Furthermore, referring to FIG. 7, since the hole interval λ is a sum of the hole diameter r and the spacing s, the hole interval λ may be about 19 μm when the average output Pavg is about 30 mW and the spacing s is about 4 μm. In FIG. 7, a scanning speed may be 200 mm/s to 400 mm/s and the hole interval may be about 19 μm.

Figure 9:
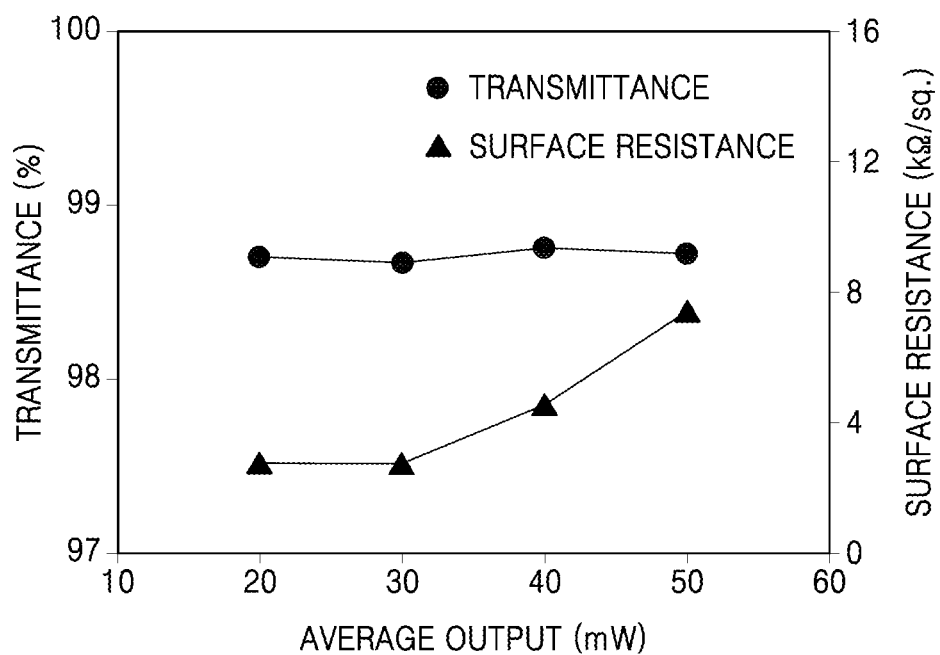
FIG. 9 is a graph illustrating a change of a transmittance and a surface resistance according to an average output of a pulse laser.

FIG. 9 is a graph illustrating a change of a transmittance (%) and a surface resistance according to an average output Pavg of a pulse laser.

Referring to FIG. 9, after a pulse width of the pulse laser is fixed to 20 ns and a repetition rate of the pulse laser is fixed to 20 kHz, the transmittance and the surface resistance of the graphene layer are measured after forming hole patterns on the graphene layer while increasing the average output Pavg from 20 mW to 50 mW.

Within a range of about 20 mW to about 50 mW of the average output Pavg, the transmittance of the graphene layer is about 98.5% or greater. As the average output Pavg increases, the surface resistance of the graphene layer shows a tendency to increase.

According to the above example embodiments, it is possible to pattern graphene holes having a desired transmittance and surface resistance by adjusting a pulse width, an average output Pavg, a scanning speed, and a repetition rate of a pulse laser. Furthermore, it is possible to fabricate a transparent electrode by using a graphene layer including hole patterns.

According to the disclosed example embodiments, in a method of patterning a graphene layer on a flexible transparent substrate by using a pulse laser, graphene holes may be relatively simply patterned on the graphene layer, and thus, a processing time may be reduced.

Furthermore, as the pulse laser has a wavelength with relatively low absorption in a wavelength region for a flexible transparent substrate, it is possible to clearly process the graphene layer only without damaging the substrate.

Furthermore, because no photo process using a photosensitive photoresist is performed, it is possible to prevent or inhibit graphene from being torn or photoresist residues which may be generated when the photoresist is removed.

It should be understood that the example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the appended figures, it will be understood by those of ordinary skill in the art that various changes in form and details may be made therein without departing from the spirit and scope as defined by the following claims.

What is claimed is:

1. A method of patterning graphene holes, the method comprising:
    placing a substrate on a stage of a laser system, the substrate having a graphene layer on a surface thereof;
    generating a pulse laser from the laser system, the pulse laser having a repetition rate and a pulse diameter;
    generating relative motion between the pulse laser and the graphene layer at a scanning speed by one of moving the stage and scanning the pulse laser; and
    forming a plurality of hole patterns spaced apart from each other on the graphene layer by irradiating the pulse laser while the graphene layer is in the relative motion with respect to the pulse laser at the scanning speed such that each repetition of the pulse laser removes material from the graphene layer in a shape of the pulse diameter of the pulse laser,
    wherein the plurality of hole patterns formed in the graphene layer are spaced apart by a minimum distance between each subsequent hole pattern having the shape of the pulse diameter formed in the graphene layer.

2. The method of claim 1, wherein the placing the substrate on the stage places a flexible transparent substrate.

3. The method of claim 2, wherein the generating the pulse laser generates a pulse laser having a wavelength of 400 nm to 1200 nm.

4. The method of claim 1, further comprising:
    reducing a surface resistance of the graphene layer by performing chemical doping on the graphene layer.

5. The method of claim 1, wherein the generating the pulse laser generates the pulse laser having a pulse width of 1 ns to 200 ns.

6. The method of claim 1, wherein the generating the pulse laser generates the pulse laser having an average output of 20 mW to 600 mW.

7. The method of claim 1, wherein the generating the pulse laser generates the pulse laser having a scanning speed of 200 mm/s to 1,000 mm/s.

8. The method of claim 1, wherein the generating the pulse laser generates the pulse laser having a repetition rate of 3 kHz to 100 kHz.

9. A method of fabricating a graphene transparent electrode, the method comprising:
    providing a flexible transparent substrate;
    forming a graphene layer on the flexible transparent substrate;
    placing the flexible transparent substrate with the graphene layer formed thereon onto a stage of a laser system;
    generating a pulse laser from the laser system, the pulse laser having a repetition rate and a pulse diameter;
    generating relative motion between the pulse laser and the graphene layer at a scanning speed by one of moving the stage and scanning the pulse laser; and
    forming a plurality of hole patterns spaced apart from each other on the graphene layer by irradiating the pulse laser while the graphene layer is in the relative motion with respect to the pulse laser at the scanning speed such that each repetition of the pulse laser removes material from the graphene layer in a shape of the pulse diameter of the pulse laser,
    wherein the plurality of hole patterns formed in the graphene layer are spaced apart by a minimum distance between each subsequent hole pattern having the shape of the pulse diameter formed in the graphene layer.

10. The method of claim 9, wherein the generating the pulse laser generates the pulse laser having a wavelength of 400 nm to 1200 nm.

11. The method of claim 9, further comprising:
    reducing a surface resistance of the graphene layer by performing chemical doping on the graphene layer.

12. The method of claim 9, wherein the generating the pulse laser generates the pulse laser having a pulse width of 1 ns to 200 ns.

13. The method of claim 9, wherein the generating the pulse laser generates the pulse laser having an average output of 20 mW to 600 mW.

14. The method of claim 9, wherein the generating the pulse laser generates the pulse laser having a scanning speed of 200 mm/s to 1,000 mm/s.

15. The method of claim 9, wherein the generating the pulse laser generates the pulse laser having a repetition rate of 3 kHz to 100 kHz.

* * * * *